United States Patent
Oinuma et al.

(10) Patent No.: US 11,898,974 B2
(45) Date of Patent: Feb. 13, 2024

(54) CHARGED PARTICLE BEAM DEVICE, COMPUTER, AND SIGNAL PROCESSING METHOD FOR CHARGED PARTICLE BEAM DEVICE

(71) Applicant: Hitachi High-Tech Corporation, Tokyo (JP)

(72) Inventors: Hiroshi Oinuma, Tokyo (JP); Wen Li, Tokyo (JP); Masashi Wada, Tokyo (JP)

(73) Assignee: HITACHI HIGH-TECH CORPORATION, Tokyo (JP)

( * ) Notice: Subject to any disclaimer, the term of this patent is extended or adjusted under 35 U.S.C. 154(b) by 196 days.

(21) Appl. No.: 17/550,140

(22) Filed: Dec. 14, 2021

(65) Prior Publication Data
US 2022/0187228 A1    Jun. 16, 2022

(30) Foreign Application Priority Data
Dec. 15, 2020   (JP) ................................ 2020-207203

(51) Int. Cl.
*G01N 23/2251* (2018.01)

(52) U.S. Cl.
CPC ..... *G01N 23/2251* (2013.01); *G01N 2223/07* (2013.01); *G01N 2223/418* (2013.01); *G01N 2223/505* (2013.01)

(58) Field of Classification Search
None
See application file for complete search history.

(56) References Cited

U.S. PATENT DOCUMENTS

| | | | |
|---|---|---|---|
| 2,576,257 A | 11/1951 | Lange | |
| 3,898,456 A | 8/1975 | Dietz | |
| 4,476,386 A * | 10/1984 | Reid | G01N 23/2252 250/307 |
| 5,412,210 A * | 5/1995 | Todokoro | H01J 37/28 850/16 |
| 5,594,245 A * | 1/1997 | Todokoro | H01J 37/3005 250/307 |
| 5,866,904 A * | 2/1999 | Todokoro | G01B 15/00 250/307 |
| 7,652,249 B2 | 1/2010 | Takane et al. | |

(Continued)

FOREIGN PATENT DOCUMENTS

| | | | |
|---|---|---|---|
| JP | H10260209 A * | 9/1998 | G01R 29/02 |
| JP | 2000-131133 A | 5/2000 | |

(Continued)

OTHER PUBLICATIONS

Office Action dated Sep. 26, 2023 in Korean Application No. 10-2021-0166437.

*Primary Examiner* — David A Vanore
(74) *Attorney, Agent, or Firm* — Miles & Stockbridge, P.C.

(57) ABSTRACT

A charged particle beam device includes a detector 109 converting a photon emitted by a scintillator into an electric signal and a signal processing unit 110 processing the electric signal from the detector 109. The signal processing unit 110 detects a peak position of the electric signal, steepness of a rising section associated with the peak position, and steepness of a falling section associated with the peak position and classifies the peak position based on the steepness of the rising section and the steepness of the falling section.

14 Claims, 9 Drawing Sheets

(56) References Cited

U.S. PATENT DOCUMENTS

| | | |
|---|---|---|
| 8,263,935 B2 | 9/2012 | Takane et al. |
| 9,222,890 B2 | 12/2015 | Kohara |
| 9,859,094 B2 | 1/2018 | Li et al. |
| 10,872,745 B2 | 12/2020 | Yamamoto et al. |
| 11,139,144 B2 | 10/2021 | Mizutani et al. |
| 11,264,201 B2* | 3/2022 | Ootsuga ................. H01J 37/222 |
| 11,749,497 B2 | 9/2023 | Mizutani et al. |
| 2004/0159787 A1* | 8/2004 | Nakasuji .................. H01J 37/28 |
| | | 250/311 |
| 2012/0025074 A1 | 2/2012 | Barbi et al. |
| 2012/0032077 A1* | 2/2012 | Matsumoto ........... H01J 37/222 |
| | | 250/311 |
| 2012/0305784 A1* | 12/2012 | Wang .................... G01T 1/1647 |
| | | 250/336.1 |
| 2013/0038485 A1* | 2/2013 | Nakamura ............ G01S 7/4865 |
| | | 342/195 |
| 2013/0228683 A1* | 9/2013 | Boughorbel ......... G01N 23/225 |
| | | 250/306 |
| 2015/0170876 A1* | 6/2015 | Janssen .................. H01J 37/28 |
| | | 250/311 |
| 2015/0362446 A1* | 12/2015 | Kato .................. G01N 23/2252 |
| | | 250/306 |
| 2015/0378243 A1 | 12/2015 | Kippelen |
| 2017/0207061 A1 | 7/2017 | Li |
| 2017/0269257 A1 | 9/2017 | Scoullar |
| 2019/0057834 A1* | 2/2019 | Friedman ................ H01J 37/06 |
| 2019/0287218 A1* | 9/2019 | Dong ...................... G06F 18/24 |
| 2019/0378679 A1* | 12/2019 | Ikeda .................... H01J 37/222 |
| 2020/0363350 A1* | 11/2020 | Irie ...................... G03F 7/70625 |
| 2022/0187228 A1* | 6/2022 | Oinuma ................ H01J 37/244 |

FOREIGN PATENT DOCUMENTS

| | | |
|---|---|---|
| JP | 4538421 B2 | 9/2010 |
| JP | 2011175811 A | 9/2011 |
| JP | 2013541799 A | 11/2013 |
| JP | 2015014628 A | 1/2015 |
| JP | 2017130334 A | 7/2017 |
| WO | 2017109843 A1 | 6/2017 |
| WO | 2018173242 A1 | 9/2018 |
| WO | 2018179029 A1 | 10/2018 |

* cited by examiner

FIG. 10
BEFORE SUBTRACTION
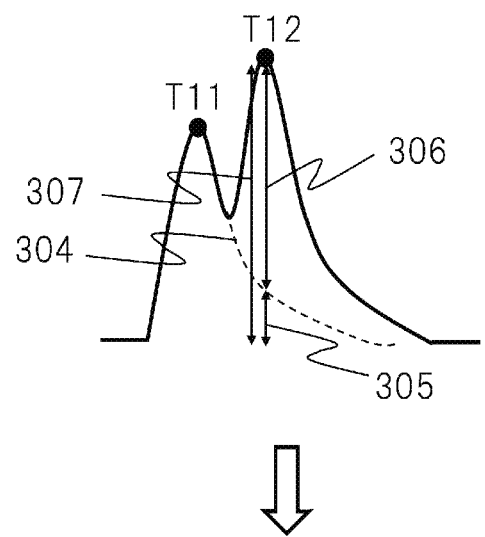
AFTER SUBTRACTION
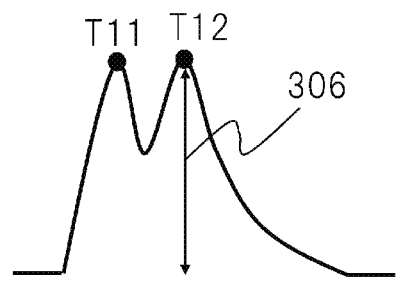

CHARGED PARTICLE BEAM DEVICE, COMPUTER, AND SIGNAL PROCESSING METHOD FOR CHARGED PARTICLE BEAM DEVICE

BACKGROUND OF THE INVENTION

1. Field of the Invention

The present invention relates to a charged particle beam device, a computer, and a signal processing method for a charged particle beam device.

2. Description of Related Art

A scanning electron microscope (SEM) is known as a charged particle beam device. The SEM forms a detection image by irradiating a sample with an electron beam and detecting, for example, a secondary electron beam generated as a result of the irradiation. At this time, the SEM is capable of obtaining a two-dimensional detection image reflecting, for example, the unevenness of the surface of the sample by scanning the electron beam or a sample stage two-dimensionally.

In general, when an electron is detected as a signal, the electron is allowed to collide with a scintillator and converted into a photon and the photon is converted into an electric signal by a detector such as a photomultiplier tube. The converted electric signal has a crest value in accordance with the number of detected electrons. Accordingly, a detection image corresponding to a scanning region can be generated by converting the peak value of the electric signal into a digital signal with an analog-to-digital converter and using the digital signal as pixel data corresponding to the scanning position of a charged particle beam device.

The charged particle beam system of WO-A-2018/179029 and the like are known as techniques of such charged particle beam devices. The charged particle beam system detects a peak from an electric signal converted by a detector, separates the electric signal into rising and falling parts, and performs processing. As a result, a ringing component can be removed from the electric signal and measurement and observation can be performed with accuracy based on a detection image.

SUMMARY OF THE INVENTION

In a case where a peak is detected from an electric signal from a detector, a method such as acquisition of the differential value of the electric signal and detection of the zero cross point at which the sign of the differential value switches from positive to negative is used. However, various noise components such as switching noise from a power supply and the noise of the detector itself as well as an original signal component attributable to a photon can be superimposed on the electric signal output by the detector. Accordingly, in the method of WO-A-2018/179029, the peak of a noise component as well as the peak of a signal component can be detected in a case where, for example, the noise component having the same level as the signal component is superimposed on the electric signal. As a result, a decline in S/N and a decline in the image quality of a detection image may arise.

In general, a method such as providing a threshold value for the crest value of an electric signal and removing a component equal to or less than the threshold value is used for noise component removal. Meanwhile, a signal component may include, for example, high- and low-energy signal pulses having different waveform characteristics. Accordingly, the low-energy signal pulse or the like as well as a noise component can be removed when the noise component is removed by a threshold value. As a result, information loss affects the contrast of a detection image and the like and the image quality of the detection image may decline.

The present invention has been made in view of the above, and an object of the present invention is to provide a charged particle beam device capable of enhancing the image quality of a detection image, a computer, and a signal processing method for a charged particle beam device.

The above and other objects and novel features of the present invention will become apparent from the description and accompanying drawings of the present specification.

A brief overview of a representative embodiment disclosed in the present application is as follows.

A charged particle beam device according to the representative embodiment of the present invention includes a detector converting a photon emitted by a scintillator into an electric signal and a signal processing unit processing the electric signal from the detector. The signal processing unit detects a peak position of the electric signal, steepness of a rising section associated with the peak position, and steepness of a falling section associated with the peak position and classifies the peak position based on the steepness of the rising section and the steepness of the falling section.

Briefly describing the effect of the representative embodiment of the invention disclosed in the present application, the image quality of a detection image obtained using the charged particle beam device can be enhanced.

BRIEF DESCRIPTION OF THE DRAWINGS

FIG. 10 is a conceptual diagram illustrating an example of the processing content of the model calculation and subtraction units in FIG. 9.

DESCRIPTION OF EMBODIMENTS

Hereinafter, various embodiments of the present invention will be sequentially described with reference to the drawings. In the following embodiments, a case where a charged particle beam device is a scanning electron microscope (SEM) using an electron beam is taken as an example. However, the charged particle beam device is not limited to the scanning electron microscope (SEM) and may be, for example, an ion microscope using an ion beam or the like.

Embodiment 1

Outline of Charged Particle Beam Device

Figure 1:
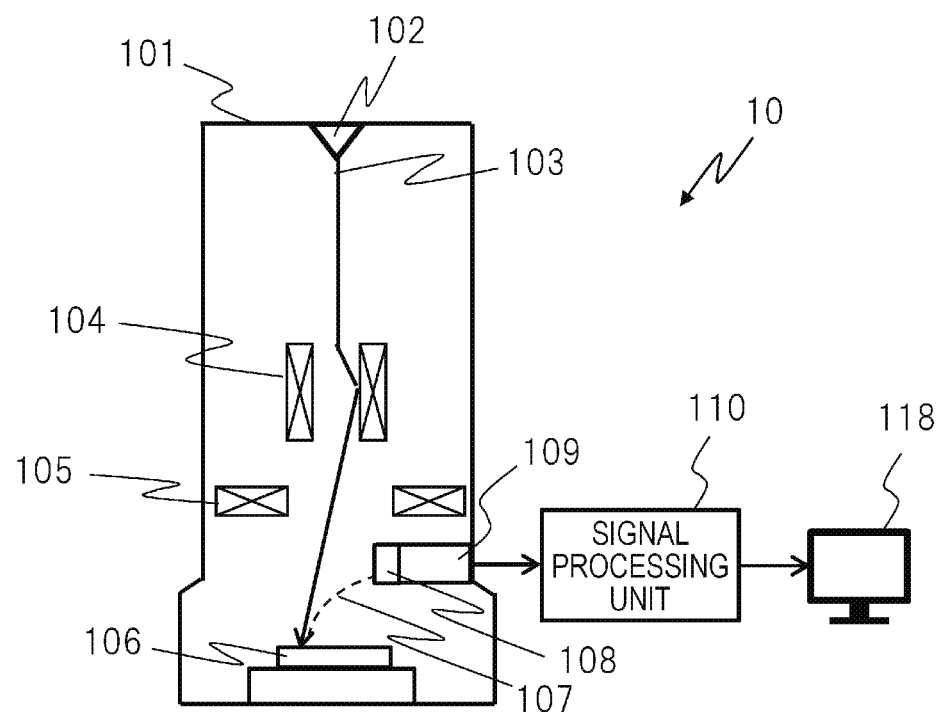
FIG. 1 is a schematic view illustrating a configuration example of a charged particle beam device according to Embodiment 1 of the present invention.

FIG. 1 is a schematic view illustrating a configuration example of a charged particle beam device according to Embodiment 1 of the present invention. A charged particle beam device 10 illustrated in FIG. 1 includes an electron microscope main body 101, a signal processing unit 110, and an image display unit 118. An electron gun 102 generating an electron beam (primary electron) 103 is installed in the electron microscope main body 101. A deflector 104 adjusts the trajectory of the electron beam 103 from the electron gun 102, and an objective lens (electron lens) 105 converges the trajectory-adjusted electron beam 103. Then, a sample 106 installed on a stage is irradiated with the converged electron beam 103.

The sample 106 generates a signal electron (for example, secondary electron, backscattered electron) 107 in response to the irradiation with the electron beam 103. A scintillator 108 converts the signal electron 107 that has collided into a photon. A detector 109 converts the photon into an electric signal and transmits the electric signal to the signal processing unit 110. The detector 109 is, for example, a silicon photomultiplier (SiPM), a photomultiplier tube (PMT), or the like. The signal processing unit 110 mainly forms a detection image by processing the electric signal from the detector 109. The image display unit 118 mainly displays the detection image formed by the signal processing unit 110.

Details of Signal Processing Unit

Figure 2:
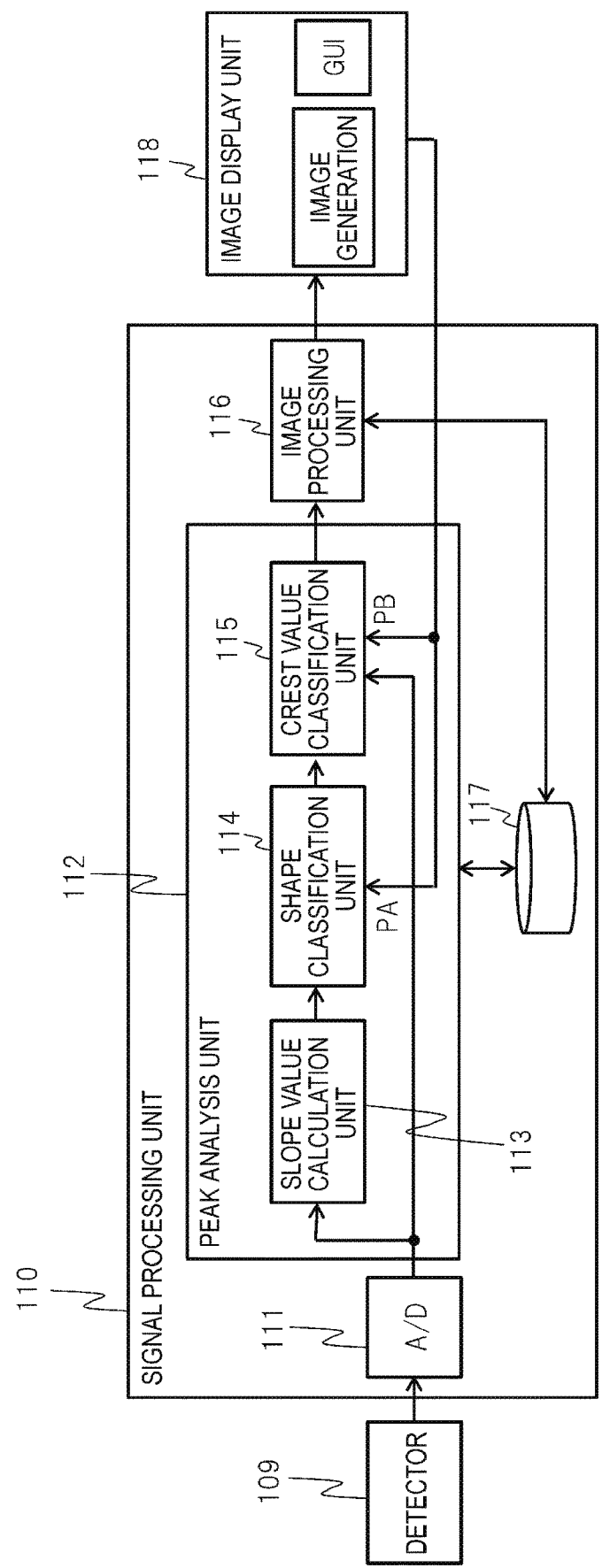
FIG. 2 is a block diagram illustrating a detailed configuration example around the signal processing unit in FIG. 1.
Figure 3:
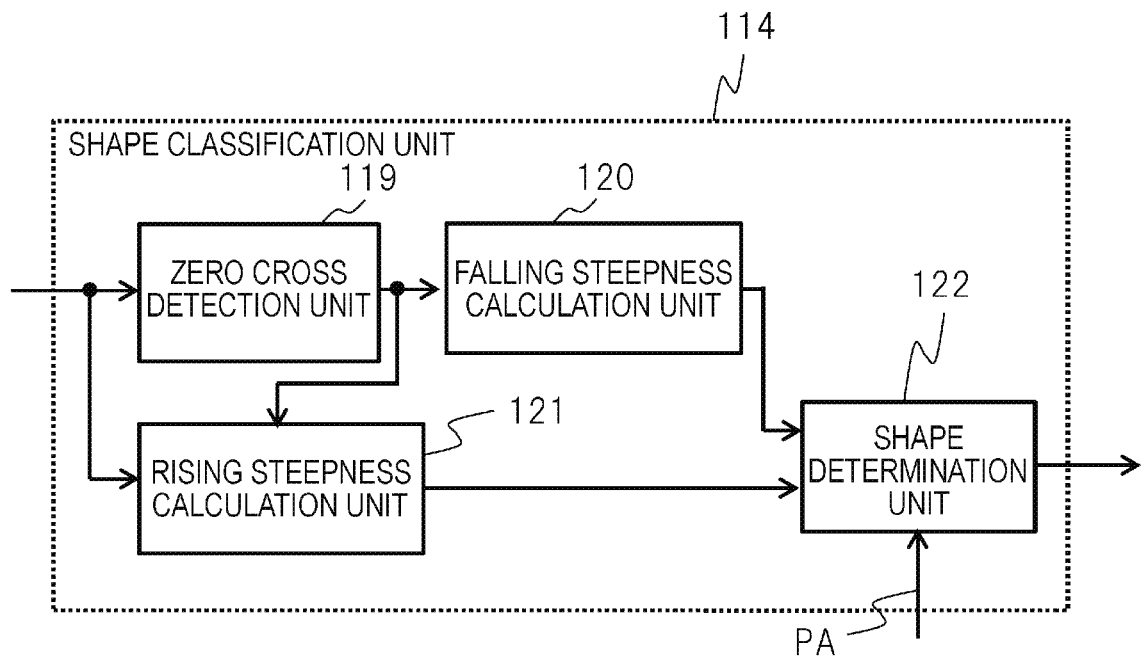
FIG. 3 is a block diagram illustrating a detailed configuration example of the shape classification unit in FIG. 2.

FIG. 2 is a block diagram illustrating a detailed configuration example around the signal processing unit FIG. 1. FIG. 3 is a block diagram illustrating a detailed configuration example of the shape classification unit in FIG. 2. The signal processing unit 110 illustrated in FIG. 2 has an A/D converter 111, a peak analysis unit 112, an image processing unit 116, and a memory 117. The memory 117 is configured by, for example, the combination of a random access memory (RAM) and a non-volatile memory.

The A/D converter 111 converts the electric signal from the detector 109 into digital data. The peak analysis unit 112 receives the digital data from the A/D converter 111 and analyzes the characteristics of the digital data and, by extension, the characteristics of the electric signal. As a result, the peak analysis unit 112 classifies the electric signal into a predetermined category. This category can include, for example, a category corresponding to a signal component attributable to a photon, a category corresponding to a noise component, and the like.

More specifically, the peak analysis unit 112 includes a slope value calculation unit 113, a shape classification unit 114, and a crest value classification unit 115. The slope value calculation unit 113 outputs differential value data by calculating, for example, the differential value of the digital data from the A/D converter 111. The shape classification unit 114 classifies the digital data from the A/D converter 111 and, by extension, the electric signal from the detector 109 by waveform shape based on the differential value data from the slope value calculation unit 113. Specifically, the shape classification unit 114 includes a zero cross detection unit 119, a falling steepness calculation unit 120, a rising steepness calculation unit 121, and a shape determination unit 122 as illustrated in FIG. 3.

The zero cross detection unit 119 detects the peak position (peak timing) included in the digital data from the A/D converter 111 and, by extension, the electric signal from the detector 109 by detecting the timing of the zero cross point at which the sign of the differential value data changes from positive to negative based on the differential value data from the slope value calculation unit 113. The falling steepness calculation unit 120 calculates the steepness of the post-zero cross point falling section (that is, the intensity of the slope or the absolute value of the slope) based on the differential value data.

At this time, the length of the falling section can change depending on the model or individual of the detector 109. Accordingly, the length of the falling section may be determined by acquiring the falling characteristic of the detector 109 in advance. The falling steepness calculation unit 120 calculates the steepness by, for example, extracting the differential value data of a certain point of the falling section or obtaining the average value of the differential value data in the falling section.

Similarly, the rising steepness calculation unit 121 calculates the steepness of the pre-zero cross point rising section based on the differential value data from the slope value calculation unit 113. The length of the rising section can also change depending on the model or individual of the detector 109. Accordingly, the length of the rising section may be determined by acquiring the rising characteristic of the detector 109 in advance. The rising steepness calculation unit 121 calculates the steepness by, for example, extracting the differential value data of a certain point of the rising section or obtaining the average value of the differential value data in the rising section.

The shape determination unit 122 classifies the electric signal including the peak position and the rising and falling sections associated with the peak position by waveform shape based on the steepness of the falling section by the falling steepness calculation unit 120, the steepness of the rising section by the rising steepness calculation unit 121, and an input classification parameter PA. Specifically, the shape determination unit 122 classifies the electric signal including the peak position into, for example, a symmetric waveform shape or an asymmetric waveform shape based on the difference between the steepness of the rising section and the steepness of the falling section. The classification parameter PA may be, for example, a threshold value of the difference for distinguishing between symmetry and asymmetry.

Returning to FIG. 2, the crest value classification unit 115 detects the crest value for each peak position from the digital data from the A/D converter 111 and, by extension, the electric signal from the detector 109 based on the peak position detected by the shape classification unit 114. Then, the crest value classification unit 115 further classifies the electric signals classified by the shape classification unit 114 by crest value based on the crest value for each peak position and an input classification parameter PB. Specifically, the crest value classification unit 115 classifies the electric signal including the peak position into a high crest value or a low crest value depending on, for example, whether or not the detected crest value is larger than the threshold value determined by the classification parameter PB.

Obtained at the peak analysis unit 112 by such processing are the peak position (peak timing) included in the electric signal, the crest value for each peak position, and the classification result based on the waveform shape and the crest value for each peak position. The digital data from the A/D converter 111 and the differential value data from the slope value calculation unit 113 are stored in the memory 117 together with timing data. The timing data represents the scanning position of the sample 106 in FIG. 1. The peak analysis unit 112 may perform processing as described above using the data stored in the memory 117.

The image processing unit 116 calculates the pixel value for each pixel based on the peak position from the peak analysis unit 112 and the crest value and the classification result for each peak position and generates an image signal including the pixel value. Specifically, the image processing unit 116 calculates the pixel value of one pixel by, for example, integrating or averaging the crest values of the peak positions included in a section corresponding to the pixel. At this time, the image processing unit 116 is capable of, for example, selecting whether or not to reflect the crest value of each peak position in the pixel value calculation based on the classification result for each peak position.

The image display unit 118 generates a detection image based on the image signal from the image processing unit 116 and displays the image on a screen. In addition, the image display unit 118 is capable of displaying a setting screen (graphical user interface: GUI) based on, for example, the processing of a setting unit (not illustrated) in the signal processing unit 110. A user can set the classification parameters PA and PB described above arbitrarily via this setting screen.

The peak analysis unit 112 and the image processing unit 116 in FIG. 2 are realized by, for example, a program stored in the memory 117 being executed by a processor such as a central processing unit (CPU), a graphics processing unit (GPU), and a digital signal processor (DSP). The peak analysis unit 112 and the image processing unit 116 may be realized by hardware such as a field programmable gate array (FPGA) and an application specific integrated circuit (ASIC) instead of such software. The peak analysis unit 112 and the image processing unit 116 may be realized by a hardware-software combination.

Here, the signal processing unit 110 of FIG. 2 is typically configured by, for example, a wiring board on which a microcontroller or the like is mounted. In this case, the A/D converter 111 and the memory 117 can be mounted on the microcontroller or the like. The peak analysis unit 112 and the image processing unit 116 can be realized by a processor in the microcontroller. The image display unit 118 of FIG. 2 is configured by, for example, a general display represented by a liquid crystal display or the like.

Method for Classification by Peak Analysis Unit

Figure 4:
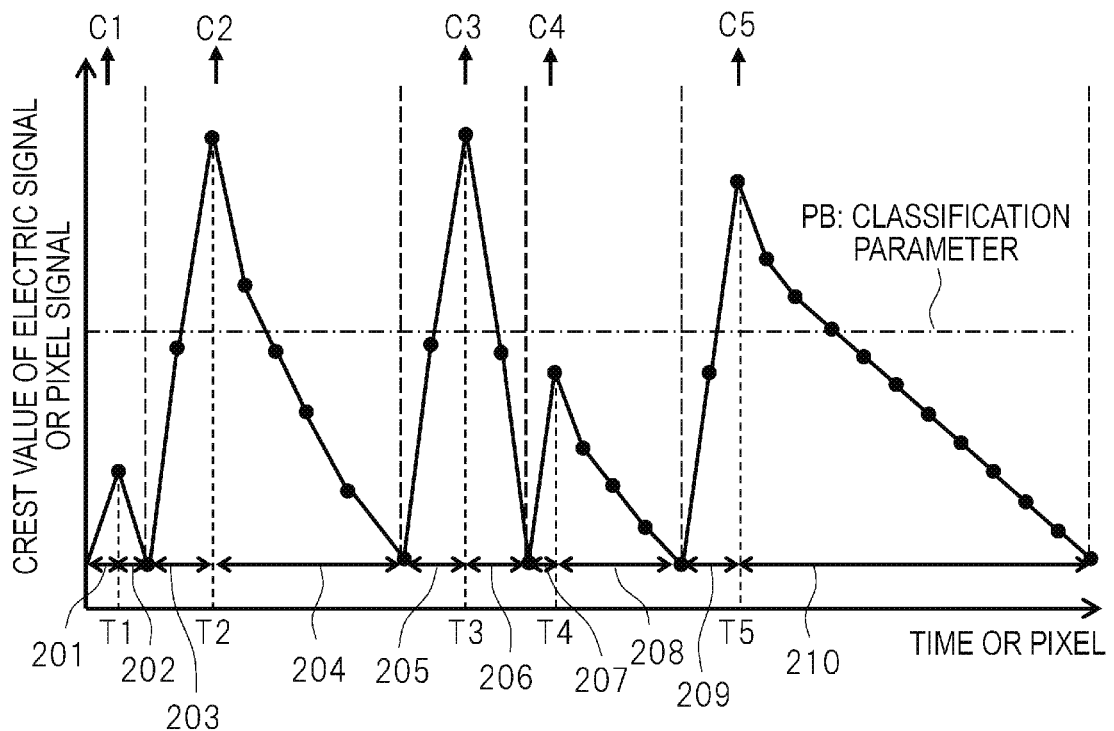
FIG. 4 is a diagram illustrating a specific example of how a peak analysis unit performs classification in the signal processing unit of FIG. 2.

FIG. 4 is a diagram illustrating a specific example of how the peak analysis unit performs the classification in the signal processing unit of FIG. 2. Illustrated in FIG. 4 is an example of the time-series change in the digital data from the A/D converter 111 and, by extension, the electric signal from the detector 109. In FIG. 4, T1 to T5 are peak positions (peak timings) detected by the zero cross detection unit 119 in the shape classification unit 114 with respect to the electric signal. Taking the peak position T1 as an example, the rising steepness calculation unit 121 and the falling steepness calculation unit 120 in the shape classification unit 114 calculate the steepness of a rising section 201 and the steepness of a falling section 202 associated with the peak position T1, respectively. The same applies to the other peak positions T2 to T5.

The shape determination unit 122 in the shape classification unit 114 calculates the difference between the steepness of the rising section (referred to as $\Delta tr$) and the steepness of the falling section (referred to as $\Delta tf$) for each peak position T1 to T5. The peak positions are classified by waveform shape based on whether or not the difference in steepness is within the range of the threshold value based on the classification parameter PA. In addition, the crest value classification unit 115 classifies the peak positions by crest value based on whether or not the crest value is larger than the threshold value based on the classification parameter PB for each of the peak positions T1 to T5.

As a result of such classification, the peak positions T1 to T5 in the example of FIG. 4 are classified into five categories C1 to C5, respectively. Specifically, the peak position T1 is classified into the category C1 indicating that $|\Delta tf - \Delta tr| \leq PA$ and crest value$\leq PB$ are satisfied, the steepness of the rising section 201 and the steepness of the falling section 202 are substantially the same, and the crest value is low. The peak position T2 is classified into the category C2 indicating that $|\Delta tf - \Delta tr| > PA$ and crest value$> PB$ are satisfied, the steepness of a rising section 203 and the steepness of a falling section 204 are different, and the crest value is high.

The peak position T3 is classified into the category C3 indicating that $|\Delta tf - \Delta tr| \leq PA$ and crest value$> PE$ are satisfied, the steepness of a rising section 205 and the steepness of a falling section 206 are substantially the same, and the crest value is high. The peak position T4 is classified into the category C4 indicating that $|\Delta tf - \Delta tr| > PA$ and crest value$\leq PB$ are satisfied, the steepness of a rising section 207 and the steepness of a falling section 208 are different, and the crest value is low. The peak position T5 is classified into the category C5 indicating that $|\Delta tf - \Delta tr| > PA \times K$ (K: constant) and crest value$> PB$ are satisfied, the steepness of a rising section 209 and the steepness of a falling section 210 are significantly different, and the crest value is low.

Here, as an example of the content represented by the classification result, the peak positions T1 and T3, where the steepness of the rising section and the steepness of the falling section are substantially the same, are highly likely to be noise components. Examples of the noise component include the switching noise of the power supplied to the signal processing unit 110, the noise of the detector 109 itself, and noise mixed from the electron microscope main body 101. It is conceivable that the peak position T2, where the steepness of the rising section and the steepness of the falling section are different (specifically, the steepness of the falling section is smaller than the steepness of the rising section) and the crest value is high, is a signal component attributable to a photon.

The peak position T4, where the crest value is low although the steepness of the rising section and the steepness of the falling section are different, may be a low-energy signal pulse or a noise component of the detector 109. Although it is conceivable that the peak position T5, where the steepness of the rising section and the steepness of the falling section are significantly different and the crest value is high, is a signal component, the signal component may be different from a normal signal component.

By classifying the peak positions by waveform shape and crest value as in this example, it is possible to distinguish between signal and noise components. For example, even the peak position T3, which is high in crest value, can be classified as a noise component based on the waveform shape. In this case, the image processing unit 116 of FIG. 2 may perform image processing excluding, for example, the peak position T3 of the category C3. As a result, an increase in, for example, S/N can be achieved and the image quality of the detection image can be enhanced.

Even the peak position T4, which is low in crest value and can be generally excluded as a noise component, can be classified as a signal component based on the waveform shape. In this case, the image processing unit 116 of FIG. 2 may perform, for example, image processing reflecting the peak position T4 of the category C4. As a result, the contrast of the detection image can be, for example, enlarged and the image quality of the detection image can be enhanced.

The classification method of the embodiment is not necessarily limited to a method as illustrated in FIG. 4 and may be a classification method using at least the steepness of a rising section and the steepness of a falling section. Desirably, the classification method of the embodiment may be a classification method that is the combination of a crest value and the classification method. An electric signal can be classified with suitability by classifying the electric signal including a peak by at least waveform shape, desirably by crest value in addition to waveform shape, as described above. Then, the image quality of the detection image and, by extension, the accuracy of measurement based on the detection image and the like can be enhanced by associating the classified categories with various implications including signal and noise components. At this time, the classification can be performed with greater suitability by allowing the classification parameters PA and PB to be set arbitrarily.

Content Displayed by Image Display Unit

Figure 5:
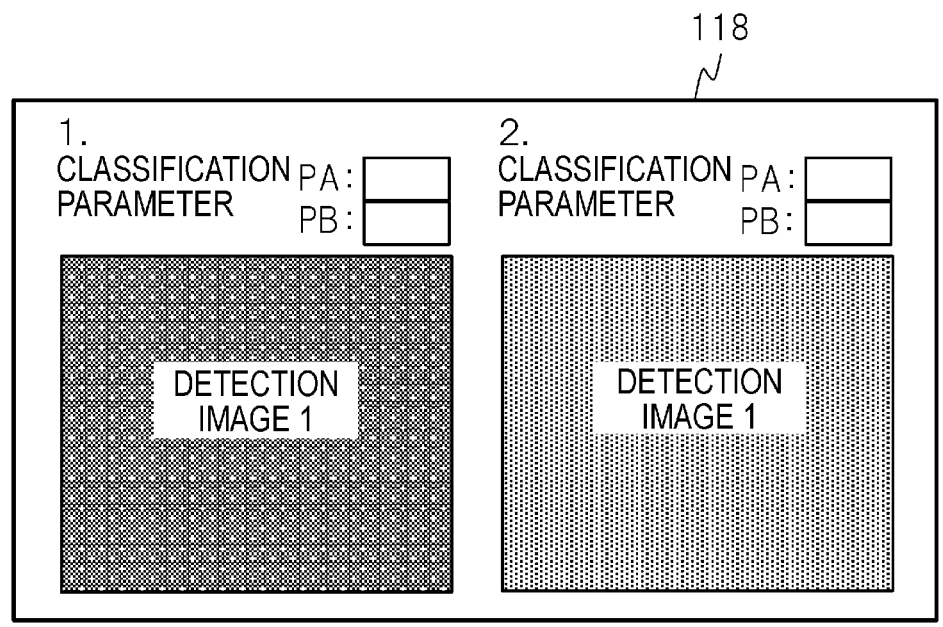
FIG. 5 is a diagram illustrating an example of the display content of the image display unit in FIG. 2.

FIG. 5 is a diagram illustrating an example of the display content of the image display unit in FIG. 2. The image display unit 118 of FIG. 5 displays a plurality of correspondences relationships between the values of the classification parameters PA and PB set via a GUI by a user and detection images generated by reflecting the classification result by the classification parameters PA and PB. At this time, the correspondence relationship between, for example, each category and a signal or noise component is determined in advance by the image processing unit 116 of FIG. 2. When the user changes the classification parameters PA and PB, the number of peak positions classified into each category changes and the image quality of the detection image (for example, brightness and contrast) also changes accordingly. The user can change the classification parameters PA and PB so as to enhance the image quality while, for example, comparing the plurality of detection images.

Figure 6:
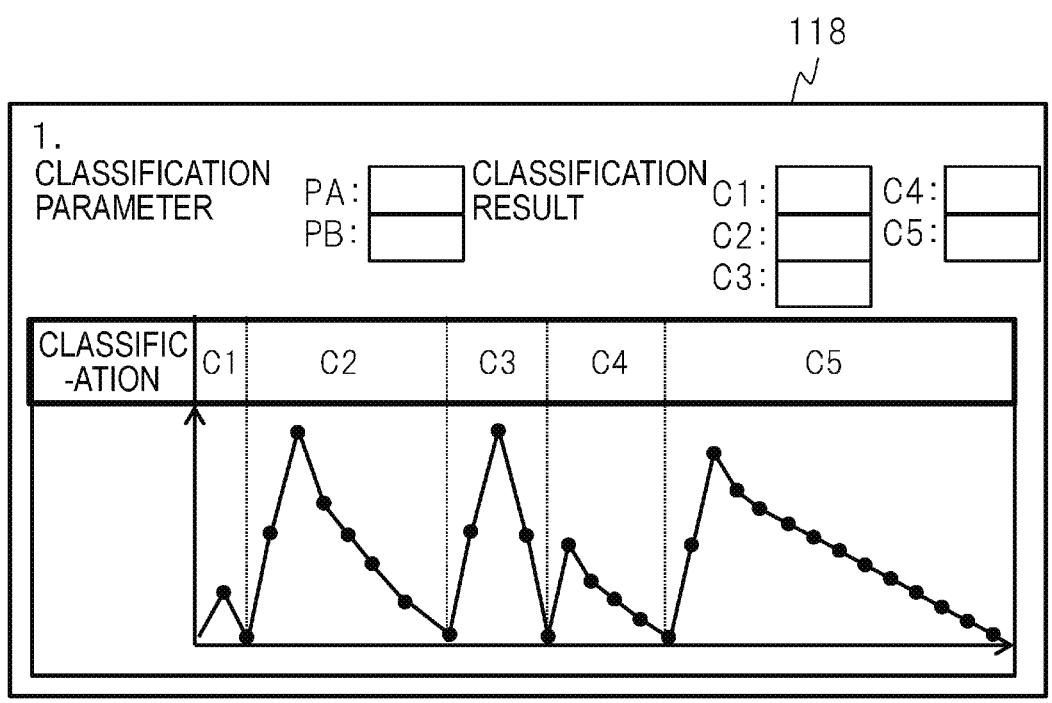
FIG. 6 is a diagram illustrating an example of other display content of the image display unit in FIG. 2.

FIG. 6 is a diagram illustrating an example of other display content of the image display unit in FIG. 2. The image display unit 118 of FIG. 6 displays a pre-imaging electric signal waveform, the values of the classification parameters PA and PB, and the number of peak positions for each of the categories C1 to C5 included in one detection image. As a result, a user can appropriately determine the values of the classification parameters PA and PB while checking the displayed electric signal waveform and the number of peak positions for each of the categories C1 to C5. At this time, regarding a peak position where it is difficult to discriminate between a signal component and a noise component, examples of which include the category C4, the user can determine whether the peak position is a signal component or a noise component after actual and visual waveform observation and can appropriately determine the classification parameters PA and PB such that the determination result can be obtained.

Form of Mounting of Signal Processing Unit
(Various Modification Examples

Figure 7:
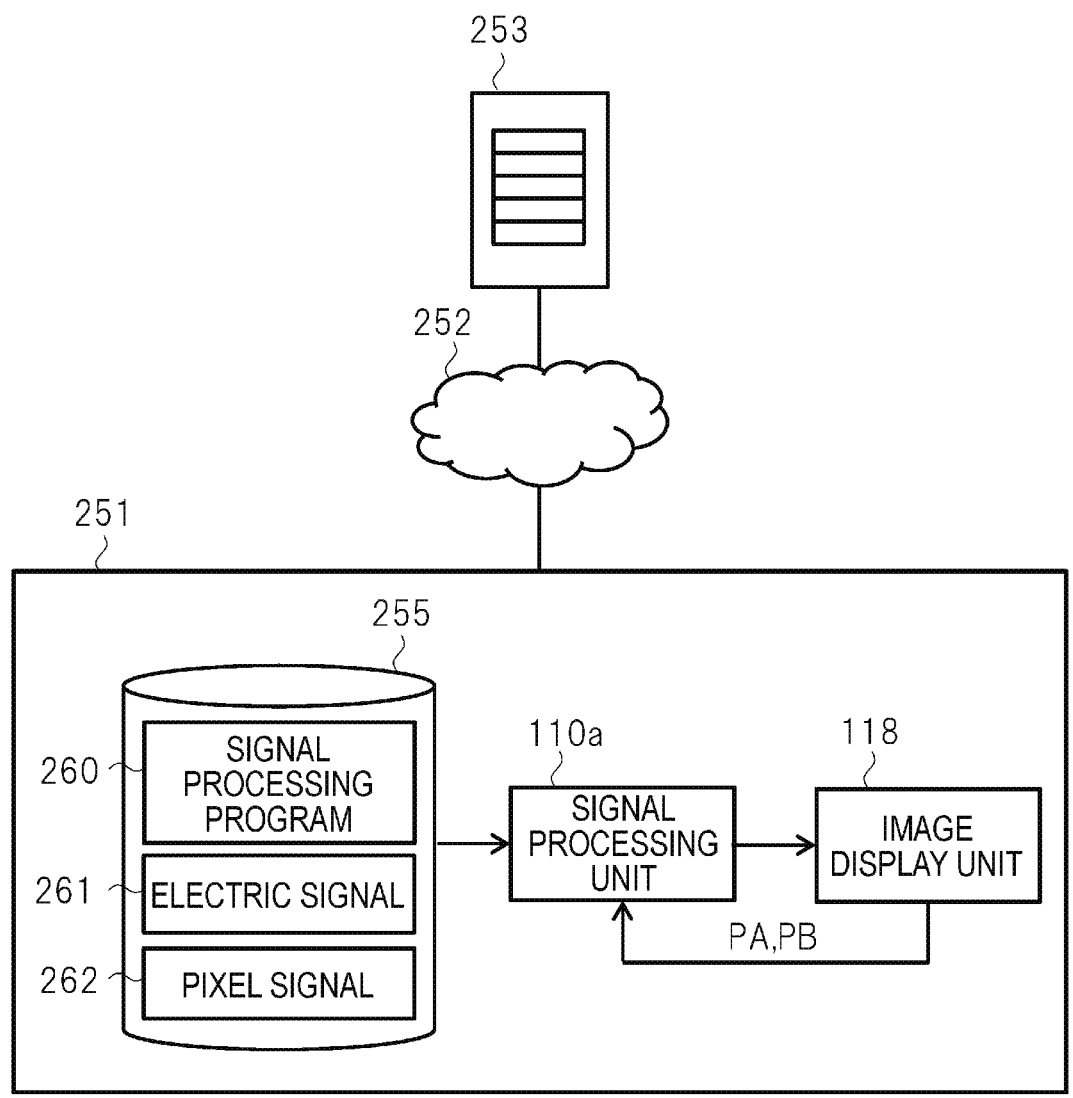
FIG. 7 is a schematic view illustrating a configuration example of a computer according to Embodiment 1 of the present invention.

FIG. 7 is a schematic view illustrating a configuration example of a computer according to Embodiment 1 of the present invention. A computer 251 illustrated in FIG. 7 includes a memory 255, a signal processing unit 110a, and the image display unit 118. The memory 255 is configured by, for example, the combination of a RAM and a non-volatile memory and stores a signal processing program 260 and the digital data of a target signal. The target signal is an electric signal 261 from the detector 109 of the charged particle beam device illustrated in FIG. 2 or a pixel signal 262 representing a change in the luminance of a detection image generated based on the electric signal.

The signal processing unit 110a is realized by a processor executing the signal processing program 260 stored in the memory 255 and functions as the peak analysis unit 112 and the image processing unit 116 illustrated in FIG. 2. The image display unit 118 is the same as in the case of FIG. 2. In this manner, the signal processing unit may be realized by the processor of the computer 251 without being limited to, for example, a microcontroller on a wiring board attached to a charged particle beam device as described with reference to FIG. 2. In other words, by pre-storing in the memory 255 the digital data from the A/D converter 111 of FIG. 2 corresponding to the electric signal 261 of FIG. 7, a user can perform, for example, adjustment of the classification parameters PA and PB as described above by offline work using the computer 251.

The digital data of the pixel signal 262 equivalent to the electric signal 261 can be obtained in a case where the digital data from the A/D converter 111 of FIG. 2 is imaged not via the peak analysis unit 112 as illustrated in FIG. 2 but as it is. The signal processing unit 110a of FIG. 7 may analyze the characteristics of the pixel signal 262 using the peak analysis unit 112 with respect to the pixel signal 262. From this point of view, the horizontal axis illustrated in FIG. 4 is time or pixel and the vertical axis illustrated in FIG. 4 is the crest value of an electric or pixel signal.

In FIG. 7, the computer 251 is connected to a server 253 via a communication network 252 such as a local area network (LAN). The server 253 may distribute the signal processing program 260 to the computer 251 via the communication network 252. Alternatively, the signal processing unit 110a may be provided on the server 253. In this case, the computer 251 may adjust the classification parameters PA and PB used by the signal processing unit 110a on the server 253 and the server 253 may accordingly cause the image display unit 118 on the computer 251 to display screens as in FIGS. 5 and 6.

The signal processing unit 110 of FIG. 2 may be connected to a server via communication network although this connection similar to the connection described above is not illustrated. For example, in a case where the signal processing unit 110 of FIG. 2 is configured by an FPGA or the like, the server is capable of performing the configuration of the FPGA via the communication network. Such configuration data or the signal processing program 260 of FIG. 7 can be stored in a non-temporary and tangible computer-readable recording medium and then supplied to a computer. Examples of such a recording medium include a magnetic recording medium such as a hard disk drive, an optical recording medium such as a digital versatile disc (DVD) and a Blu-ray disc, and a semiconductor memory such as a flash memory.

Signal Processing Method

Figure 8:
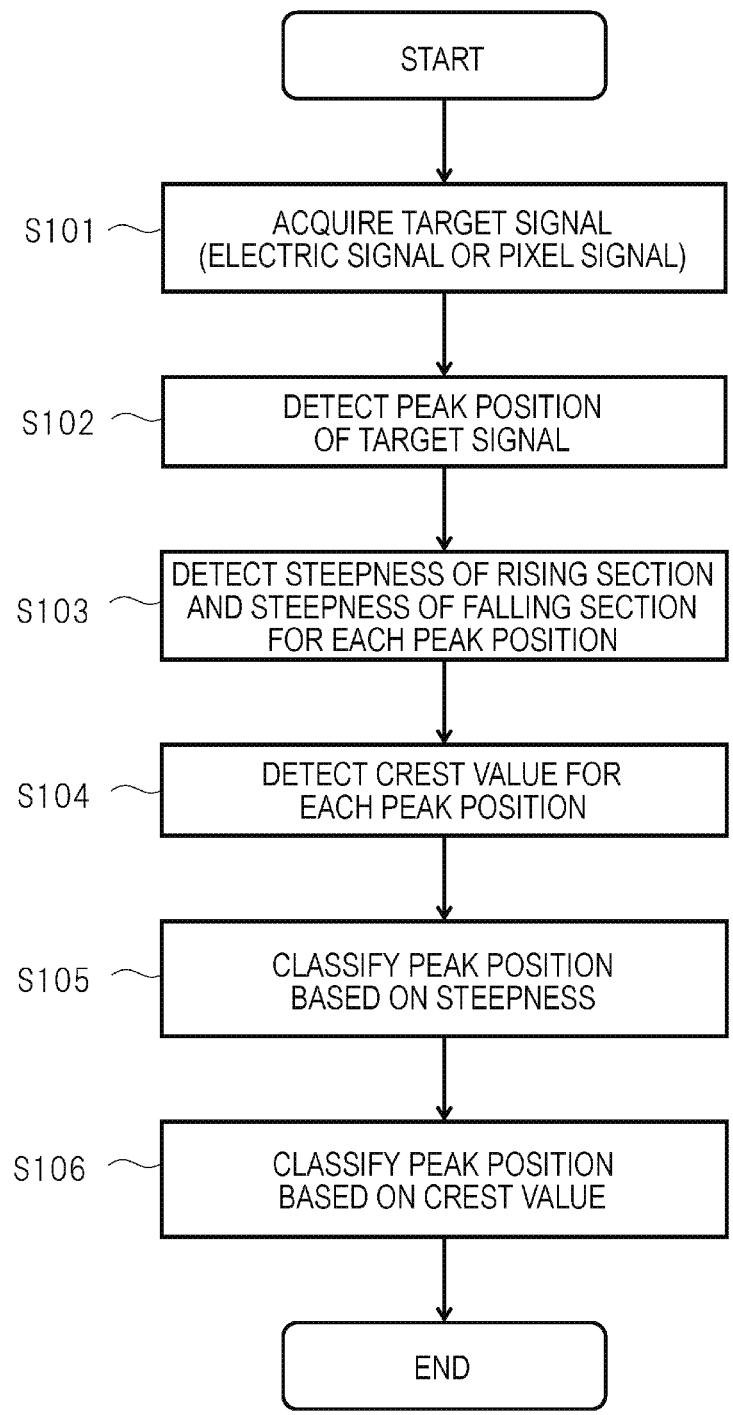
FIG. 8 is a flow diagram illustrating an example of the processing content of the main part is a signal processing method for the charged particle beam device according to Embodiment 1 of the present invention.

FIG. 8 is a flow diagram illustrating an example of the processing content of the main part in a signal processing method for the charged particle beam device according to Embodiment 1 of the present invention. In FIG. 8, the signal processing unit 110 (110a) acquires, as a target signal, an electric signal from the detector 109 or a pixel signal representing a change in the luminance of a detection image generated based on the electric signal (Step S101.) Subsequently, the signal processing unit 110 (110a) detects the peak position of the target signal (Step S102).

Next, the signal processing unit 110 (110a) detects the steepness of the rising section associated with the peak position and the steepness of the falling section associated with the peak position for each detected peak position (Step S103). Subsequently, the signal processing unit 110 (110a) detects the crest value for each detected peak position (Step S104). Subsequently, the signal processing unit 110 (110a) classifies the peak position based on the detected steepness of the rising section and the detected steepness of the falling section (Step S105) and classifies the peak positon based on the detected crest value (Step S106).

Main Effect of Embodiment 1

Typically, the image quality of a detection image using the charged particle beam device can be enhanced by using the method of Embodiment 1 described above. Specifically, the peak position can be classified with high accuracy as a signal component or a noise component and an increase in S/N can be achieved. In addition, the peak position can be classified with a low-energy signal pulse and a noise component distinguished from each other, information loss can be prevented, and the contrast of the detection image can be enhanced. Further, at this time, it becomes possible to provide a user with, for example, a mechanism for enhancing the image quality of the detection image offline, that is, a classification parameter adjustment mechanism. As a result, user convenience improvement and the like can be achieved.

Embodiment 2

Details of Signal Processing Unit

Figure 9:
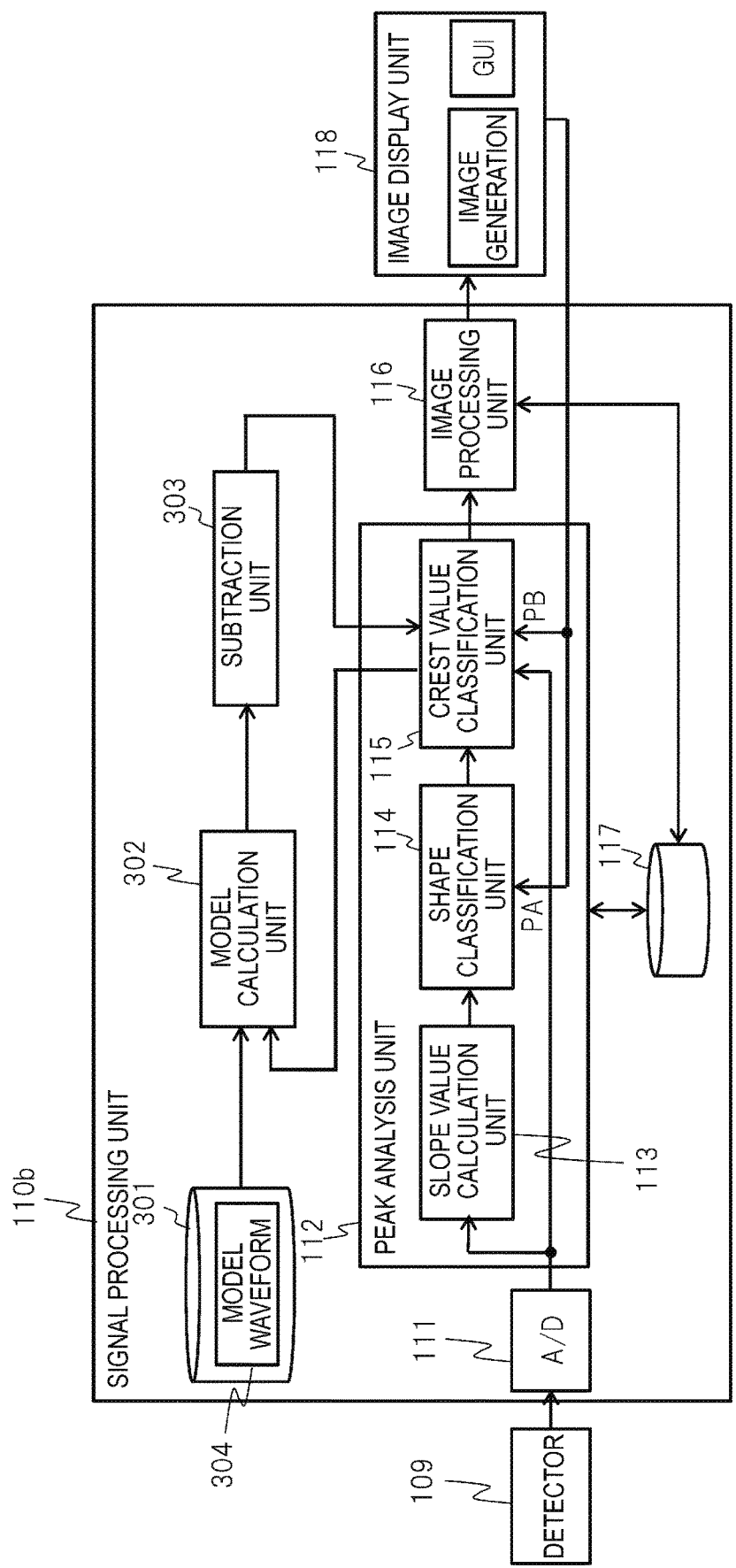
FIG. 9 is a block diagram illustrating a detailed configuration example around the signal processing unit in FIG. 1 in a charged particle beam device according to Embodiment 2 of the present invention.

FIG. 9 is a block diagram illustrating a detailed configuration example around the signal processing unit in FIG. 1 in a charged particle beam device according to Embodiment 2 of the present invention. FIG. 10 is a conceptual diagram illustrating an example of the processing content of the model calculation and subtraction units in FIG. 9. A signal processing unit 110b illustrated in FIG. 9 is the signal processing unit 110 of FIG. 2 to which a memory 301 storing the data of a model waveform 304, a model calculation unit 302, and a subtraction unit 303 have been added. The rest of the configuration and operation is the same as in FIG. 2.

As illustrated in the pre-subtraction waveform of FIG. 10, particularly in a case where the light receiving amount of the detector 109 is large and, by extension, in a case where the energy set in the electron gun 102 of FIG. 1 is high or the like, a peak position T12 of the second time point may occur in the falling section associated with a peak position T11 of the first time point in the electric signal from the detector 109. Such a phenomenon is called pile-up. In the event of pile-up, no correct value can be obtained as the crest value of the peak position T12.

In this regard and as described in Embodiment 1, the crest value classification unit 115 in the peak analysis unit 112 first detects the crest value at the peak position T11 of the first time point and a crest value 307 at the peak position T12 of the second time point. The model calculation unit 302 calculates a crest value 305 at the second time point by changing the crest value in chronological order, based on the data of the model waveform 304 stored in the memory 301, and starting from the time point and the crest value of the peak position T11 as illustrated in FIG. 10.

More specifically, the model calculation unit 302 at this time calculates the time between the two detected peak positions T11 and T12. The model calculation unit 302 holds the falling characteristic (time) of the detector 109 in advance, and it is considered that pile-up has occurred in a case where the time between the peak positions T11 and T12 is equal to or less than the pre-held falling characteristic (time). In this case, the model calculation unit 302 calculates the crest value 305 at the second time point based on the data of the model waveform 304 stored in the memory 301. The data of the model waveform 304 is, for example, an arithmetic expression or a table representing a time-series change in the falling characteristic of the detector 109.

The subtraction unit 303 corrects the crest value 307 into a crest value 306 as a subtraction result by subtracting the crest value 305 calculated by the model calculation unit 302 from the crest value 307 at the peak position T12 as illustrated in the post-subtraction waveform of FIG. 10. The crest value classification unit 115 classifies the peak position T12 based on the post-correction crest value 306.

Main Effect of Embodiment 2

The same effects as the various effects described in Embodiment 1 can be obtained by using the method of Embodiment 2 described above. Further, in the case of the event of pile-up in the electric signal from the detector 109, the crest value of the peak position can be detected with high accuracy and the peak position can be classified correctly.

Embodiment 3

Details of Signal Processing Unit

Figure 11:
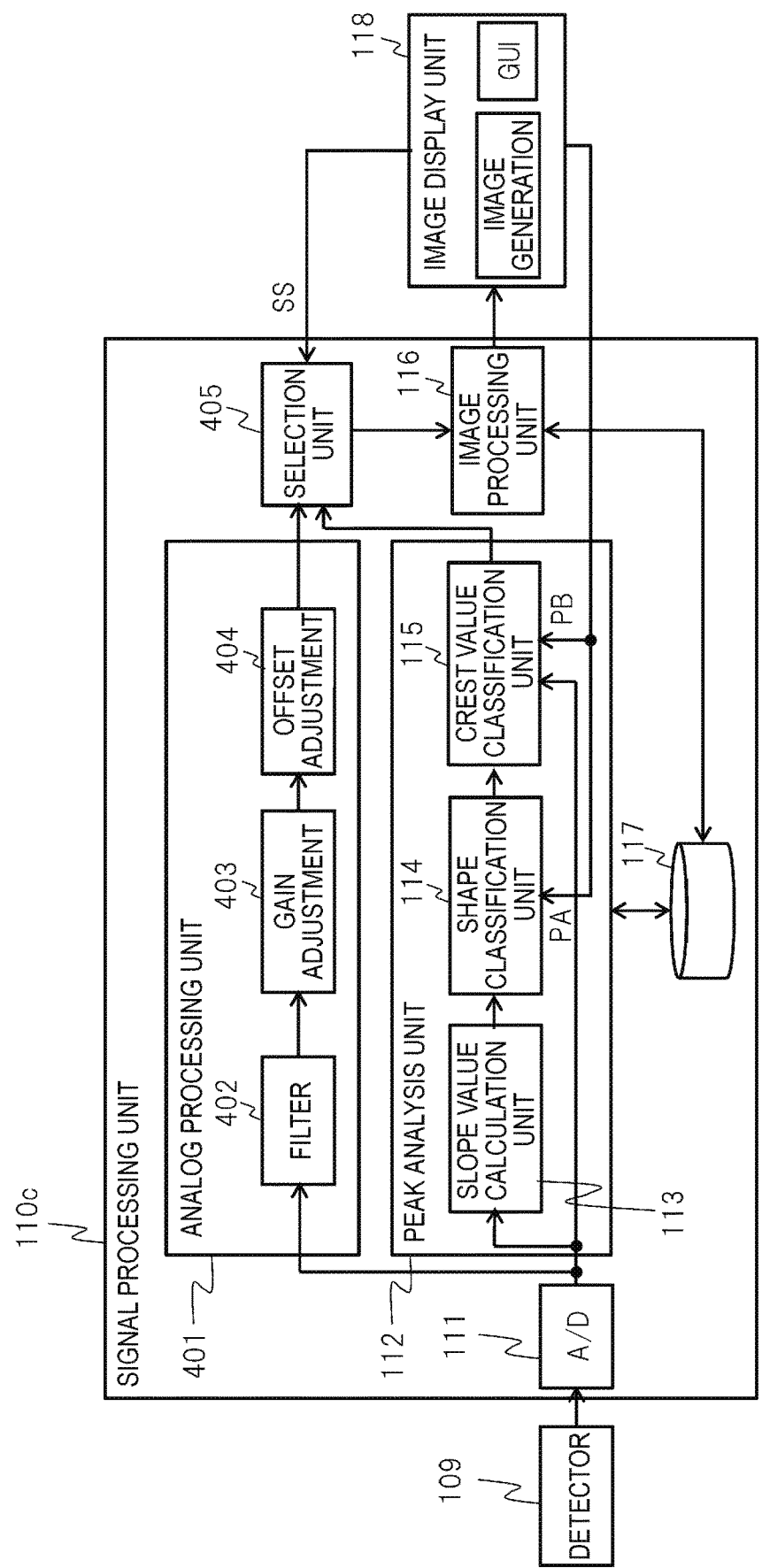
FIG. 11 is a block diagram illustrating a detailed configuration example around the signal processing unit in FIG. 1 in a charged particle beam device according to Embodiment 3 of the present invention.

FIG. 11 is a block diagram illustrating a detailed configuration example around the signal processing unit in FIG. 1 in a charged particle beam device according to Embodiment 3 of the present invention. A signal processing unit 110c illustrated in FIG. 11 is the signal processing unit 110 of FIG. 2 to which an analog processing unit (second signal processing unit) 401 and a selection unit 405 have been added. The rest of the configuration and operation is the same as in FIG. 2.

In the event of, for example, an increase in the light receiving amount of the detector 109, electric signal waveforms may overlap due to pile-up as described in Embodiment 2 and an electric signal close to a DC signal may be obtained as a result. In this case, peak position detection as described in Embodiment 1 may not be performed with ease. In this regard, the analog processing unit 401 is provided in parallel with the peak analysis unit 112.

The analog processing unit 401 includes a filter 402, a gain adjustment unit 403, and an offset adjustment unit 404. The filter 402, which is a low pass filter (LPF) or the like, removes high-frequency noise by filtering the electric signal from the detector 109, the digital data from the A/D converter 111 to be specific. The gain adjustment unit 403 adjusts the amplitude value of the electric signal, the digital data to be specific, such that the contrast becomes appropriate when the electric signal is imaged. The offset adjustment unit 404 adjusts the offset value of the electric signal, the digital data to be specific, such that the brightness becomes appropriate when the electric signal is imaged. In addition, noise equal to or less than the offset value can be removed by the offset value adjustment.

The selection unit 405 selects a signal from the peak analysis unit 112 or a signal from the analog processing unit 401 as a detection image base signal based on the light receiving amount of the detector 109. Then, the selection unit 405 outputs the selected signal to the image processing unit 116. Here, a selection signal SS of the selection unit 405 is determined by a user via, for example, the GUI of the image display unit 118. Specifically, the user may determine the selection signal SS on the analog processing unit 401 side in a case where, for example, high energy is set in the electron gun 102 of FIG. 1. In another example, a configuration may be used in which the selection signal SS is automatically determined depending on whether or not the energy set in the electron gun 102 is higher than a threshold value.

Main Effect of Embodiment 3

The same effects as the various effects described in Embodiment 1 can be obtained by using the method of Embodiment 3 described above. Further, the electric signal from the detector 109 can be processed even in a case where the light receiving amount of the detector 109 is large and it becomes difficult to detect the peak position.

The present invention is not limited to the examples described above and includes various modification examples. For example, the examples described above have been described in detail so that the present invention is described in an easy-to-understand manner and the present invention is not necessarily limited to what includes every configuration described above.

A part of the configuration of one example can be replaced with the configuration of another example, and the configuration of one example can be added to the configuration of another example. Another configuration is addable, deletable, and replaceable in relation to a part of the configuration of each example.

What considered necessary for description is illustrated as to control and information lines, and not all control and information lines are illustrated on the product. It may be considered that almost all configurations are interconnected in practice.

What is claimed is:

1. A charged particle beam device comprising:
    a detector configured to convert a photon emitted by a scintillator into an electrical signal; and
    a first signal processor coupled with the detector and including a first microcontroller configured to:
        receive the electrical signal from the detector;
        detect a peak position of the electrical signal, a steepness of a rising section associated with the peak position, and a steepness of a falling section associated with the peak position;
        classify the peak position based on the steepness of the rising section and the steepness of the falling section; and
        form a detection image based on the classification of the peak position.

2. The charged particle beam device according to claim 1, wherein the first microcontroller of the first signal processor is further configured to calculate a difference between the steepness of the rising section and the steepness of the falling section and to classify the peak position based on the difference and a first classification parameter representing a threshold value of the difference.

3. The charged particle beam device according to claim 2, wherein the first microcontroller of the first signal processor is further configured to detect a crest value of the peak position and classifies the peak position based on the crest value and a second classification parameter representing a threshold value of the crest value.

4. The charged particle beam device according to claim 2, wherein the first microcontroller of the first signal processor is further configured to classify the peak position as a signal component attributable to the photon or a noise component based on the first classification parameter.

5. The charged particle beam device according to claim 3, wherein the first microcontroller of the first signal processor is further configured to detect a first crest value as the crest value at the peak position of a first time point and a second crest value as the crest value at the peak position of a second time point following the first time point, calculate the crest value at the second time point by changing the crest value in chronological order, based on a predetermined model waveform, and starting from the first time point and the first crest value, and correct the second crest value by subtracting the calculated crest value from the second crest value.

6. The charged particle beam device according to claim 1, further comprising:
    a second signal processor arranged in parallel with the first signal processor and including a second microcontroller configured to perform filtering and offset value adjustment on the electrical signal.

7. An image detector comprising:
    a memory storing, as a target signal, an electrical signal received from a detector of a charged particle beam device or a pixel signal representing a change in luminance of a detection image generated based on the electrical signal; and
    a processor configured to
        detect a peak position of the target signal, a steepness of a rising section associated with the peak position, and a steepness of a falling section associated with the peak position;
        classify the peak position based on the steepness of the rising section and the steepness of the falling section; and
        form a detection image based on the classification of the peak position.

8. The image detector according to claim 7, wherein the processor is further configured to calculate a difference between the steepness of the rising section and the steepness of the falling section and to classify the peak position based on the difference and a first classification parameter representing a threshold value of the difference.

9. The image detector according to claim 8,
wherein the processor is further configured to detect a crest value of the peak position and to classify the peak position based on the crest value and a second classification parameter representing a threshold value of the crest value.

10. The image detector according to claim 8,
wherein the processor is further configured to classify the peak position as a signal component attributable to a photon or a noise component based on the first classification parameter.

11. A signal processing method for a charged particle beam device, comprising:
reading a target signal from a memory storing, as the target signal, an electrical signal from a detector of a charged particle beam device or a pixel signal representing a change in luminance of a detection image generated based on the electrical signal;
detecting a peak position of the target signal, a steepness of a rising section associated with the peak position, and a steepness of a falling section associated with the peak position;
classifying the peak position based on the steepness of the rising section and the steepness of the falling section; and
forming a detection image based on the classification of the peak position.

12. The signal processing method for a charged particle beam device according to claim 11,
wherein said step of classifying the peak position further comprises calculating a difference between the steepness of the rising section and the steepness of the falling section and classifying the peak position based on the difference and a first classification parameter representing a threshold value of the difference.

13. The signal processing method for a charged particle beam device according to claim 12,
wherein said step of detecting the peak position of the target signal further comprises detecting a crest value of the peak position and classifying the peak position based on the crest value and a second classification parameter representing a threshold value of the crest value.

14. The signal processing method for a charged particle beam device according to claim 12,
wherein the peak position is classified as a signal component attributable to the photon or a noise component based on the first classification parameter.

* * * * *